United States Patent
Le Tiec et al.

(10) Patent No.: US 8,735,259 B2
(45) Date of Patent: May 27, 2014

(54) METHOD OF PRODUCING INSULATION TRENCHES IN A SEMICONDUCTOR ON INSULATOR SUBSTRATE

(75) Inventors: Yannick Le Tiec, Crolles (FR); Laurent Grenouillet, Rives (FR); Maud Vinet, Rives (FR)

(73) Assignee: Commissariat a l'Energie Atomique et aux energies alternatives, Paris (FR)

( * ) Notice: Subject to any disclaimer, the term of this patent is extended or adjusted under 35 U.S.C. 154(b) by 0 days.

(21) Appl. No.: 13/555,356

(22) Filed: Jul. 23, 2012

(65) Prior Publication Data

US 2013/0189825 A1    Jul. 25, 2013

(30) Foreign Application Priority Data

Jul. 27, 2011   (FR) ...................... 11 56854

(51) Int. Cl.
   *H01L 21/76*         (2006.01)
(52) U.S. Cl.
   USPC ........... 438/400; 438/424; 438/425; 438/433; 438/442; 438/450
(58) Field of Classification Search
   None
   See application file for complete search history.

(56) References Cited

U.S. PATENT DOCUMENTS

| | | | |
|---|---|---|---|
| 5,313,094 A * | 5/1994 | Beyer et al. ................. | 257/622 |
| 2003/0153136 A1 | 8/2003 | Matsumoto et al. | |
| 2003/0216044 A1 | 11/2003 | Lin et al. | |
| 2008/0213971 A1 | 9/2008 | Mitsuhira et al. | |
| 2008/0318391 A1 | 12/2008 | Ryu | |
| 2011/0057287 A1 | 3/2011 | Mitsuhira et al. | |

FOREIGN PATENT DOCUMENTS

KR    2002-0006976 A    1/2002

OTHER PUBLICATIONS

French Preliminary Search Report Issued Nov. 1, 2011 in Patent Application No. FR 1156854 (with English translation of Categories of Cited Documents).

* cited by examiner

*Primary Examiner* — Kyoung Lee

(74) *Attorney, Agent, or Firm* — Oblon, Spivak, McClelland, Maier & Neustadt, L.L.P.

(57) ABSTRACT

A method for producing one or plural trenches in a device comprising a substrate of the semiconductor on insulator type formed by a semiconductive support layer, an insulating layer resting on the support layer and a semiconductive layer resting on said insulating layer, the method comprising steps of: a) localised doping of a given portion of said insulating layer through an opening in a masking layer resting on the fine semiconductive layer, b) selective removal of said given doped area at the bottom of said opening.

7 Claims, 5 Drawing Sheets

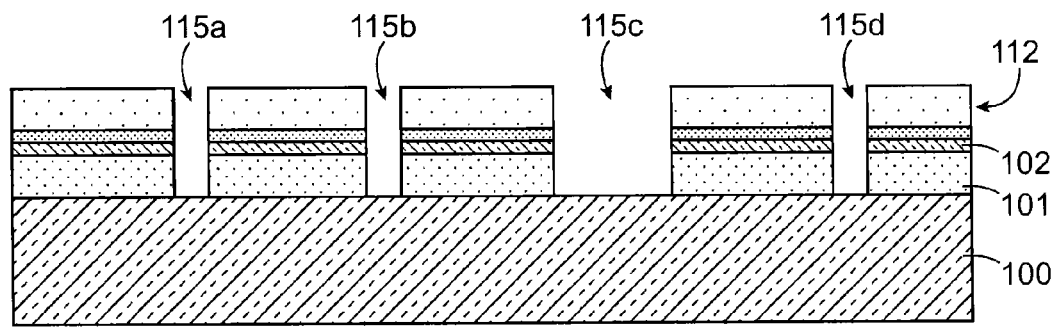
FIG.4A
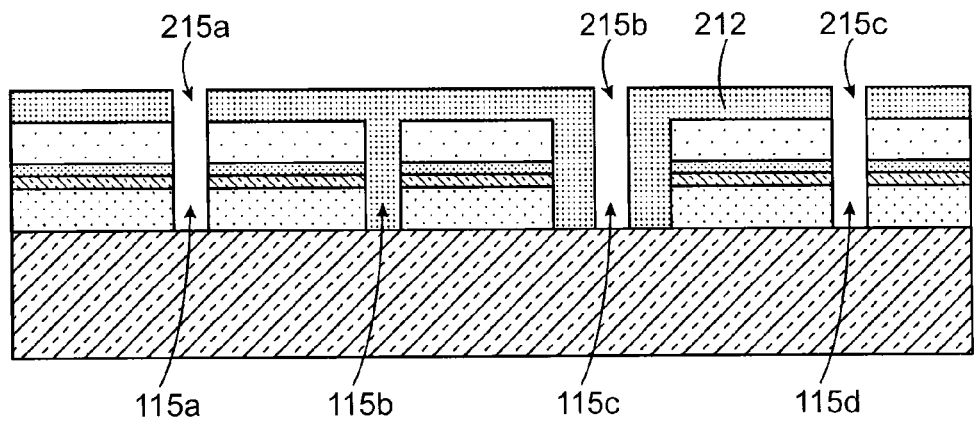
FIG.4B
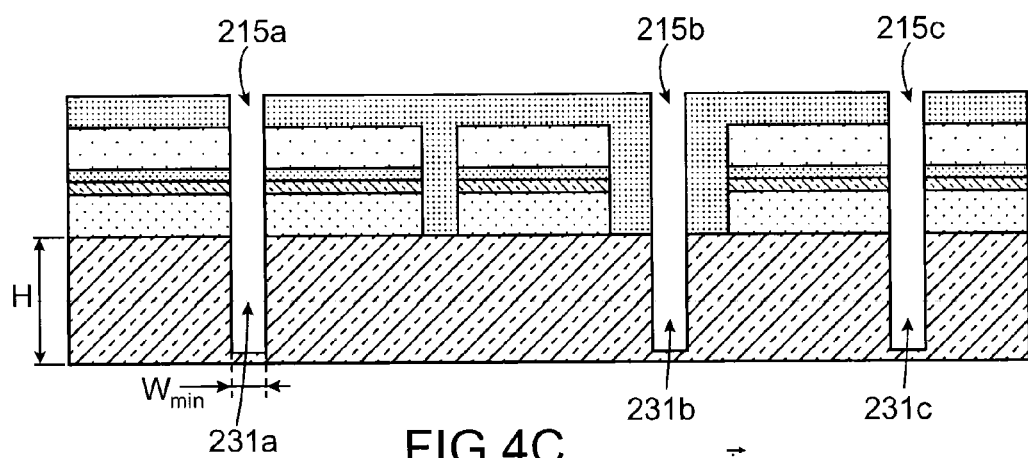
FIG.4C
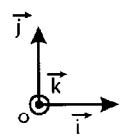

METHOD OF PRODUCING INSULATION TRENCHES IN A SEMICONDUCTOR ON INSULATOR SUBSTRATE

TECHNICAL FIELD

The present invention relates to the field of microelectronic devices provided with insulation trenches produced in a substrate of the semiconductor on insulator type, in particular of the SOI (silicon on insulator) type.

It concerns a method of producing isolation trenches between elements or regions of a microelectronic device, in which precise control of the depth of the trenches is implemented.

It may apply in particular to producing devices requiring isolation trenches passing through the semiconductor support layer of a semiconductor on insulator substrate having identical depths.

PRIOR ART

In order to isolate from each other elements of a microelectronic device, for example components or sets of components, and to prevent current leakages between these elements, producing so-called surface isolation trenches are known, commonly referred to as STI (STI standing for "shallow trench isolation") in a substrate.

Producing STI isolation zones can be effected prior to the production of transistors and can comprise steps of etching a substrate so as to form holes and then filling the holes by means of a dielectric material, such as for example $SiO_2$.

For some applications, it is necessary to produce so-called "deep" isolation trenches (deep STI). Documents US 2008/0213971 A1 and US 2011/0057287 A1 disclose production, on the same substrate, of isolation trenches of different depths.

Controlling the depth of the trenches may prove to be decisive.

When surface isolation trenches 19 are produced in a semiconductor on insulator substrate comprising a semiconductor support layer 10, for example based on Si, covered by an insulating layer 11, for example buried oxide, itself covered with a fine semiconductor layer 12, for example based on Si, it may be sought to place the bottom of these trenches at the same level with the interface 13 between the insulating layer 11 and the semiconductor layer 10.

Controlling the depth of such trenches poses a problem, as shown by the example embodiments in FIGS. 1A-1C.

In FIG. 1A, the surface trenches 19 were produced by etching through a masking 20, and passing through the fine semiconductor layer 12 and part of the insulating layer 11. In this example, the trenches 19 do not reach the interface 13 between the insulating layer 11 and the semiconductor layer 10 and stop on a remaining thickness of the insulating layer 11.

This remaining thickness may pose a problem, in particular in the case where it is wished subsequently to produce deep isolation trenches 19.

On the example in FIG. 1B, the trenches 19 were produced so as to go beyond the interface 13 between the insulating layer 11 and the semiconductor layer 10 and pass through a remaining thickness of the semiconductor support layer 10.

Excessively deep isolation trenches may, in some devices, give rise to an increase in the electrical resistance of the areas of the semiconductor support layer 10, which may prove to be detrimental in particular when these areas belong to an n-type well region or to a ground plane region.

To produce trenches 19 that stop precisely at the interface 13, it is possible to carry out etching of the material of the insulating layer, for example $SiO_2$, selective vis-à-vis the semiconductor support layer 10, which may for example be based on Si.

However, this selective etching has a tendency to continue into areas of the insulating layer 11 that were not designed to be removed. In FIG. 1C, over-etching of the insulating layer 11 is illustrated. The trenches 19 produced have a splayed bottom representing excessive etching of the insulating layer 11.

This can make it more difficult to fill the trenches with a dielectric material.

The problem is posed of finding a novel method of producing isolation trenches that do not have the above mentioned drawbacks.

DISCLOSURE OF THE INVENTION

The invention concerns first of all a method of producing one or more trenches in a substrate of the semiconductor on insulator type formed by a semiconductive support layer, an insulating layer resting on said support layer and based on a given dielectric material, and a semiconductive layer resting on said insulating layer.

This method may comprise steps of:

a) localised doping of a given portion of said insulating layer through an opening in a masking layer resting on the fine semiconductor layer;

b) selective removal of said given doped area at the bottom of said opening.

This selective removal is effected by selective etching of said doped area vis-à-vis the given dielectric material of said insulating layer.

The etching is also selective vis-à-vis the semiconductor support layer.

Thus, by means of these etching selectivities, it is possible to form at least one trench the bottom of which stops precisely at the interface between the insulating layer and the semiconductive support layer.

Prior to step a), a step of anisotropic etching of a thickness of the insulating layer through at least one opening in a masking layer resting on the fine semiconductor layer can be performed. The given portion corresponds to a remaining thickness of said insulating layer kept at the bottom of said opening following this anisotropic etching.

By performing this anisotropic etching prior to step a), the thickness of the portion of insulating layer situated at the bottom of the opening is first of all reduced without risking reducing other parts of this insulating layer situated under the masking layer. Then the selective removal step b) makes it possible to remove the remaining portion of the insulating layer situated at the bottom of the opening while stopping precisely at the interface between the insulating layer and the support layer.

During step b), the walls of the opening can be covered by protective areas. These protective areas may have been produced from a given material chosen so that the insulating layer can be etched selectively vis-à-vis this given material.

The protective areas may have been formed by:
deposition of a protective layer in said opening,
selective doping of the protective area so that a region situated at the bottom of said opening is doped,
removal of the doped regions of said protective layer.

The invention also concerns the production of deep isolation trenches.

Thus the method may also comprise, after step b), etching of the semiconductive support layer in line with said opening.

BRIEF DESCRIPTION OF THE DRAWINGS

The present invention will be better understood from a reading of the description of example embodiments given purely indicatively and in no way limitatively, referring to the accompanying drawings, wherein:

FIGS. 4A-4C illustrate an example of the method for producing deep isolation trenches passing partially through the semiconductive support layer of a substrate of the semiconductor on insulator type.

Identical, similar or equivalent parts of the various figures bear the same numerical references so as to facilitate passing from one figure to another.

The various parts shown in the figures are not necessarily shown to a uniform scale, in order to make the figures more legible.

DETAILED DISCLOSURE OF PARTICULAR EMBODIMENTS

An example of the method for producing isolation trenches according to the invention will now be described in relation to FIGS. 2A-2G.

The starting material of this method is a substrate of the semiconductor on insulator type, which can be of the SOI type, and comprises a semiconductive support layer 100, for example based on Si, covered with an insulating layer 101, for example of $SiO_2$, surmounted by a fine semiconductive layer 102, for example based on Si. "Fine" semiconductor layer means a semiconductive layer with a thickness of less than 100 nanometers, for example with a thickness of between 2 and 100 nanometers or around 10 or 20 nanometers.

The insulating layer 101 can have a thickness x of between for example 25 and 150 nanometers.

First of all a masking 112 is formed, covering the fine semiconductive layer 102.

Figure 1A:
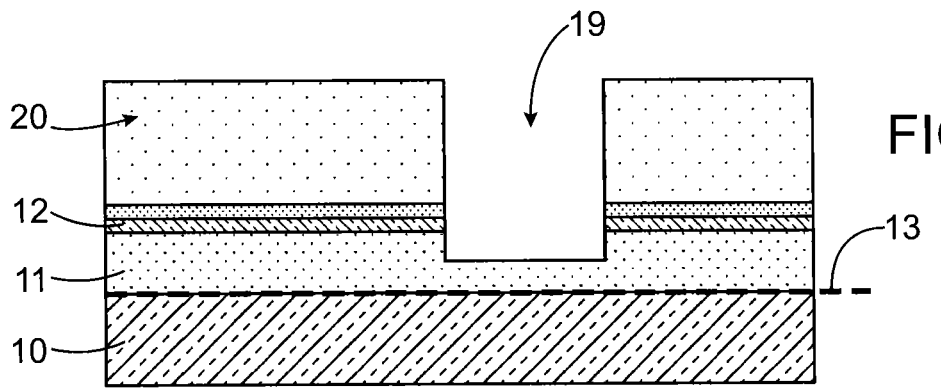
FIGS. 1A, 1B and 1C illustrate different embodiments of isolation trenches through a substrate of the semiconductor on insulator type.
Figure 1B:
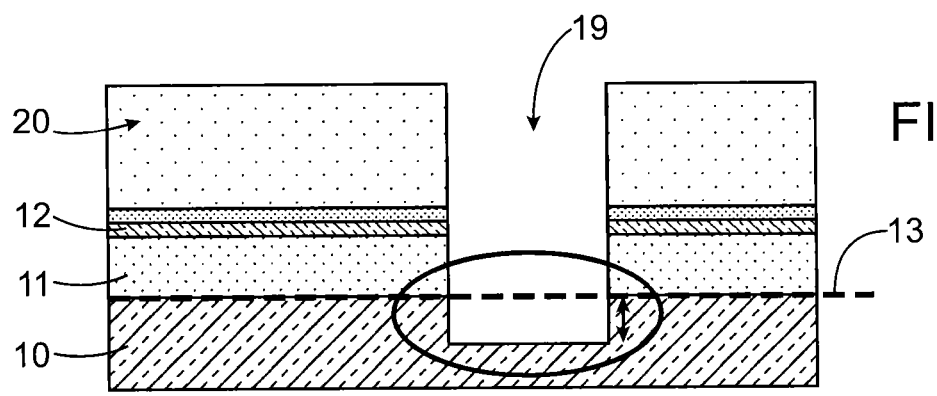
Figure 1C:
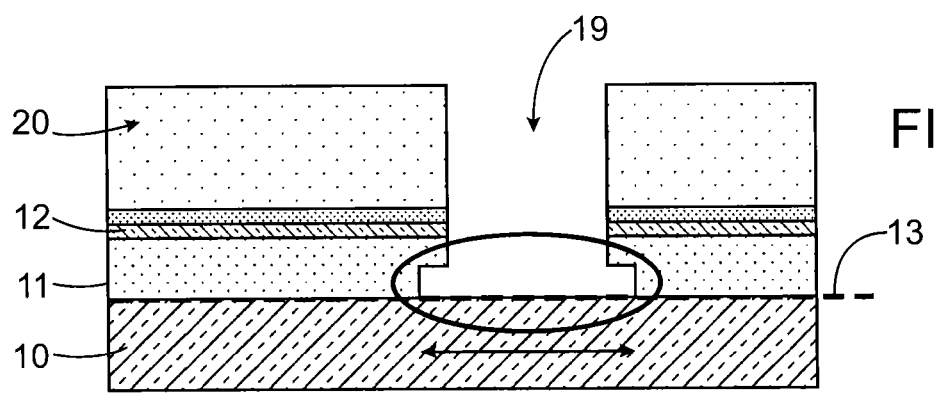
Figure 2A:
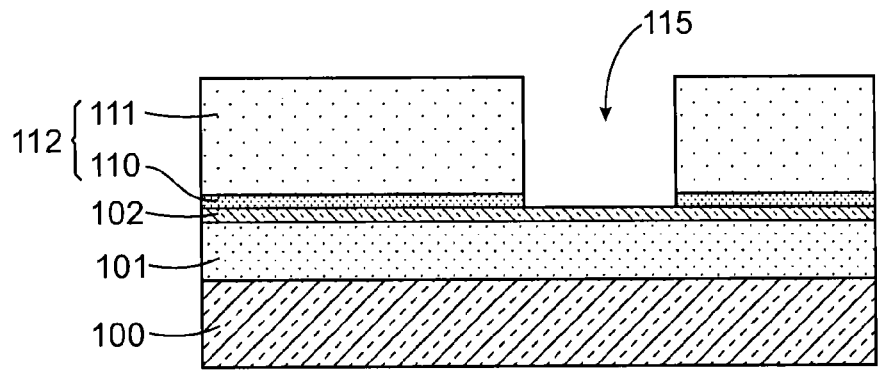
FIGS. 2A-2G illustrate an example of a method according to the invention, of producing isolation trenches through a substrate of the semiconductor on insulator type.

This masking 112 can be insulating and formed for example by a stack of layers of dielectric materials with, for example, a first fine dielectric layer 110 based on $SiO_2$, covered by a second dielectric layer 111 based on a different dielectric material, for example $Si_3N_4$, covering the first fine dielectric layer 110. The masking 112 can be produced so as to comprise at least one opening 115 revealing the fine semiconductive layer 102 (FIG. 2A).

Next, through the opening 115, an etching of the fine semiconductive layer 102 is effected, and then of a given thickness of the insulating 101, so as to extend the opening 115, which then emerges on the insulating layer 101.

Figure 2B:
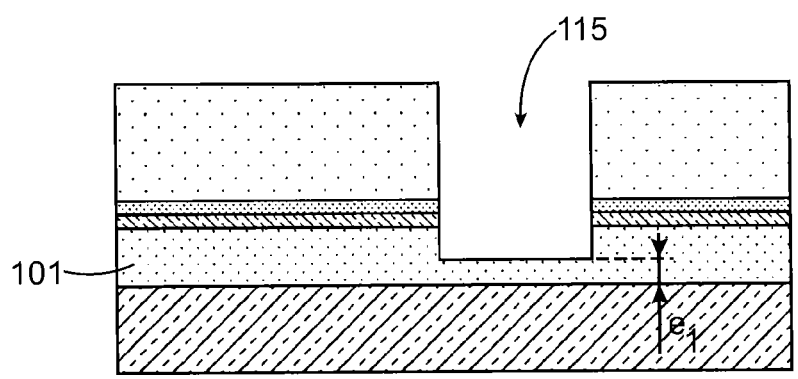

This etching may be anisotropic. An etching of this type makes it possible to extend the opening 115 without broadening it. The anisotropic etching may for example be a dry etching carried out for example by reactive ion etching commonly referred to as RIE. The etching is carried out so as to preserve a given thickness $e_1$ of the insulating layer 101, which may for example be between 20% and 80% of its initial thickness, or for example between 5 nanometers and 20 nanometers (FIG. 2B).

Following this partial etching of the insulating layer 101, a portion 101a of given thickness $e_1$, for example equal to one half x/2 of the thickness x of the insulating layer 101, is preserved at the bottom of the opening 115.

Figure 2C:
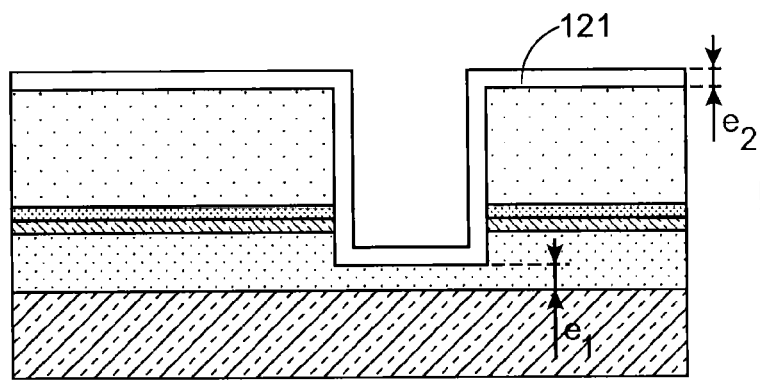
Figure 2D:
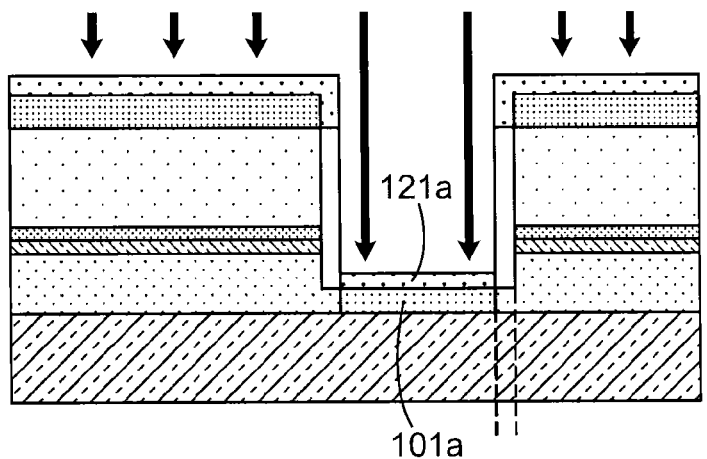
Figure 2E:
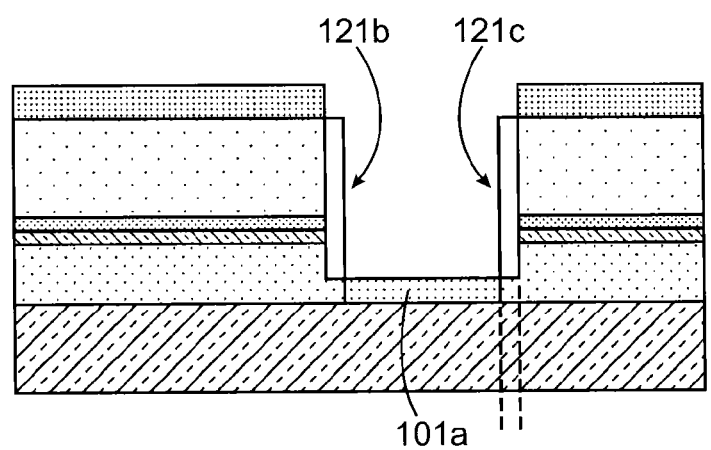

Then a so-called "protective" layer 121 of thickness $e_2$ is formed, for example between 3 nanometers and 5 nanometers, covering in particular the vertical walls as well as the bottom of the opening 115, the portion of the insulating layer 111 situated at the bottom of the opening 115 being covered by this protective layer 121 (FIG. 2C).

The protective layer 121 can be chosen for example based on a material different from that of the insulating layer 101, and in particular based on the material that can be etched selectively vis-à-vis the material of the insulating layer 101. The protective layer 121 may for example be based on $Si_3N_4$.

Next a doping of the protective layer 121 is effected, in particular of a region 121a of the latter situated at the bottom of the opening 115. Regions of the protective layer situated on either side of the opening 115 and resting on the masking 112 are also doped.

This doping can be done by at least one ion implantation, for example by means of H, and/or He, and/or Ar.

A doping of the remaining portion 101a of the insulating layer 101 situated at the bottom of the opening 115 under the protective layer 121 is also effected, optionally during the step of implantation of the region 121a or during another step.

This doping can also be effected, by means of at least one ion implantation, for example by means of H and/or He, and/or Ar.

In order to dope the portion 101a of the insulating layer situated at the bottom of the hole 119, several successive implantations can be effected.

A first implantation, for example by means of Ar, at a dose for example of $5*10^{15}$ and at for example an energy of around 3 keV, followed by a second implantation for example using Ar, at a dose for example of $5*10^{15}$ and an energy for example of around 15 keV, can be effected in order to implant a protective layer 121 based on nitride with a thickness for example of around 9 nm, as far as a portion 101a of the insulating layer with a thickness for example of around 10 to 15 nanometres.

Next a partial removal of the protective layer 121 is effected. This removal can be effected by selective etching so as to eliminate regions of the protective layer 121 that were doped, while keeping the regions 121b, 121c of this protective layer 121 that were not doped.

The preserved regions 121b, 121c of the protective layer 121 line part of the vertical walls of the opening 115, and in particular cover areas of the fine semiconductive layer 102 and of the masking 112 in the opening 115.

Removal of the remaining portion 101a of the insulating layer 101 situated at the bottom of the opening 105 can be effected by selective etching vis-à-vis the material of the support layer 100, while the fine semiconductor layer 102 and the masking 112 are protected by the regions 121b, 121c of the protective layer 121.

Because of the doping of the remaining part 101a of the insulating layer 101 while the rest of this insulating layer 101 is not doped, an etching selectivity between this portion 101a and the rest of the insulating layer 101 is also effected.

Figure 2F:
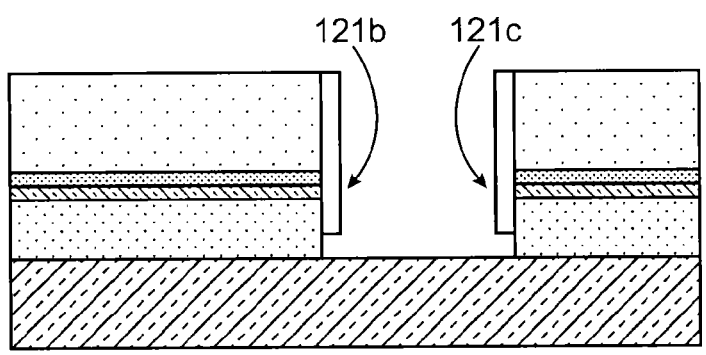

This selectivity may for example be 4/1, so that the non-doped parts of the insulating layer 101 are consumed four times more slowly than the doped portion 101a (FIG. 2F).

The etching of the remaining portion 101a of the insulating layer 101 can be effected for example by means of HF, for example by means of an etching solution commonly referred to as BOE (BOE standing for "buffered oxide etch") composed of a buffer, such as ammonium fluoride ($NH_4F$) and hydrofluoric acid (HF). This etching can lead to the removal of areas of the insulating layer 101 situated vertically in line with the regions 121a, 121b of the protective area.

Figure 2G:
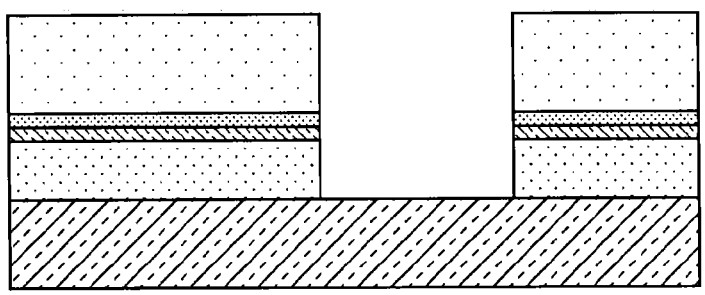

Next a removal of the protective regions 121a, 121b is effected, for example by means of $H_3PO_4$ (FIG. 2G).

Figure 3A:
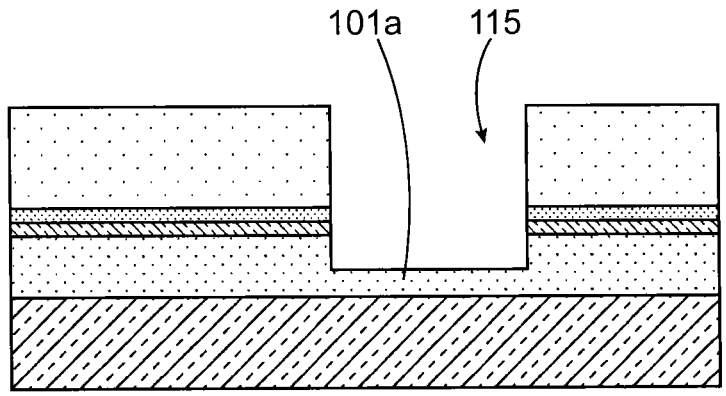
FIGS. 3A-3C illustrate another example of the method according to the invention, of producing isolation trenches through a substrate of the semiconductor on insulator type.
Figure 3B:
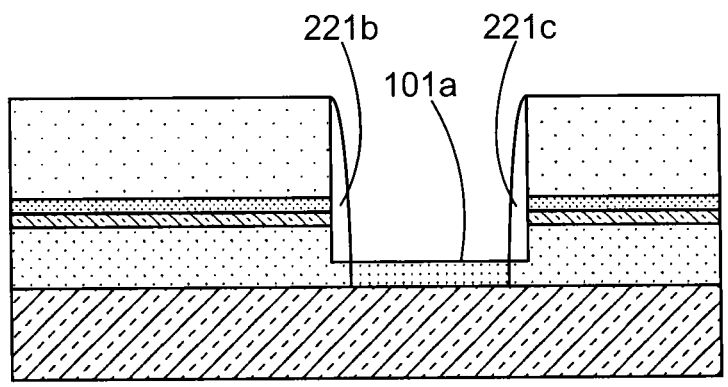
Figure 3C:
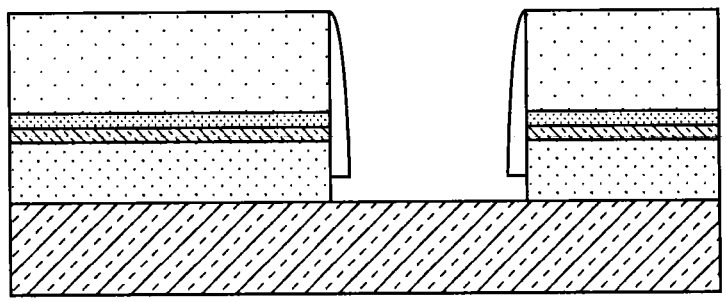

A variant embodiment is illustrated in FIGS. 3A-3C.

As for the example method previously described, a masking 112 can be formed on the fine semiconductor layer 102, and then at least one opening 115 produced in this masking 112.

Next the insulating layer 101 is partially etched at the bottom of the opening, keeping a portion 101a of the insulating layer 101 (FIG. 3A).

The protective layer 121 is next formed. An anisotropic etching of this protective layer 121 can then be etched, for example by means of RIE etching (RIE standing for "reactive ion etching"). This etching is effected so as to keep regions 221b, 221c lining the vertical walls of the opening 115, the portion 101a being revealed at the bottom of the opening 115 (FIG. 3B).

This etching can present selectivity between the material of the protective layer 121 and that of the insulating layer 101.

Then doping of the portion 101a revealed at the bottom of the opening 115 is effected.

Next removal is effected of the remaining portion 101a of the insulating layer 101 by selective etching vis-à-vis the rest of the insulating layer 101 (FIG. 3C). This insulating etching 101 may for example be a selective etching.

One or other of the examples of the method described in relation to FIGS. 2 and 3 can be used during a method for producing isolation trenches of different depths.

Another example of the method according to the invention will now be given in relation to FIGS. 4A-4C.

As in one or other of the example methods described previously, first of all a first masking 112 is formed covering the fine semiconductive layer 102 of a semiconductor on insulator substrate, the masking 112 comprising openings 115a, 115b, 115c, 115d revealing the fine semiconductive layer 102.

Then, through the openings 115a, 115b, 115c, 115d, an etching of the fine semiconductive layer 102 and then of a given thickness of the insulating layer 101 is effected by anisotropic etching through the openings 115a, 115b, 115c, 115d so as to preserve a given thickness of the insulating layer 101.

Then, as in the method examples described previously, a doping is effected of the given thickness of the insulating layer 101a, which is then etched selectively vis-à-vis the rest of the insulating layer 101. This etching is stopped when this thickness is removed and the interface between the insulating layer 101 and the support layer 100 has been reached.

In this way uniformity is obtained between the respective depths of the openings 115a, 115b, 115c, 115d.

Next a second masking 212 is formed over the first masking 112. This second masking 212 may for example be a masking based on photosensitive resin and comprise holes 215a, 215b, 215c each revealing an opening among said openings 115a, 115c, 115d, formed in the first masking 112. The second masking 212 can be produced so as to fill in at least one opening 115b among the openings in the first masking (FIG. 4B).

Then trenches 230a, 230b, 230c are produced through the holes 215a, 215b, 215c in the second masking 212. For this purpose, an etching is effected of the remaining thickness of the insulating layer 101 situated at the bottom of the holes 215a, 215b, 215c, as well as of the semiconducting support layer 110 in line with the openings 115A, 115c, 115d. This etching can be done for example using $HBr/O_2$. Deep trenches 213a, 213b, 213c passing through part of the thickness of the support layer 100 are then produced (FIG. 4C). These deep trenches 213a, 213b, 213c may have a critical width or dimension Wmin (the critical dimension or width of the trenches being their smallest dimension measured in a plane parallel to the plane $[O; \vec{i}; \vec{k}]$ of the orthogonal reference frame $[O; \vec{i}; \vec{j}; \vec{k}]$) lying for example between 30 and 100 nanometers, or for example around 50 nanometers. The deep trenches 231a, 231b, 231c may also have a depth H of between for example 50 nanometers and 5 micrometers or between 50 nanometers and 500 nanometers, for example 180 or 200 nanometers.

The uniformity of depth between the openings 115a, 115b, 115d produced during the step described previously in relation to FIG. 4A makes it possible also to obtain a uniformity of depth between the trenches 231a, 231b, 231c passing through the support layer 100.

Next a filling of the trenches can be effected by means of a dielectric material.

The invention claimed is:

1. A method of producing one or plural trenches in a device comprising a substrate for a semiconductor on insulator device formed by a semiconductive support layer, an insulating layer resting on the support layer and a fine semiconductive layer resting on said insulating layer, the method comprising:
   localised doping of a given portion of said insulating layer through an opening in a masking layer resting on the fine semiconductive layer; and
   removing, by selective etching, said given doped portion at the bottom of said opening.

2. A method according to claim 1, comprising, prior to the localised doping, anisotropic etching of a thickness of the insulating layer through at least one opening in the masking layer resting on the fine semiconductive layer, said given portion corresponding to a remaining thickness of said insulating layer preserved at the bottom of said opening.

3. A method according to claim 1, wherein during the removing, the walls of the opening are protected by protective areas.

4. A method according to claim 3, further comprising forming the protective areas by:
   depositing a protective layer in said opening,
   selective doping of the protective layer, at least one region situated at the bottom of said opening being doped, and
   removing the doped regions of said protective layer.

5. A method according to claim 1, further comprising, after the removing, etching of the semiconductive support layer in line with said opening.

6. A method according to claim 4, wherein
   the depositing is performed prior to the localised doping, and
   the localised doping and the selective doping are performed in a single doping step.

7. A method according to claim 4, further comprising removing un-doped regions of the protective layer after removing of the given doped portion of the insulating layer at the bottom of the opening is performed.

* * * * *